(12) United States Patent
Hisai

(10) Patent No.: US 6,736,206 B2
(45) Date of Patent: May 18, 2004

(54) THERMAL PROCESSOR

(75) Inventor: Akihiro Hisai, Kyoto (JP)

(73) Assignee: Dainippon Screen Mfg. Co., Ltd., Kyoto (JP)

(*) Notice: Subject to any disclaimer, the term of this patent is extended or adjusted under 35 U.S.C. 154(b) by 145 days.

(21) Appl. No.: 10/091,427

(22) Filed: Mar. 7, 2002

(65) Prior Publication Data

US 2002/0139523 A1 Oct. 3, 2002

(30) Foreign Application Priority Data

Mar. 28, 2001 (JP) .................................... P2001-091691

(51) Int. Cl.[7] .............................................. F28B 29/00
(52) U.S. Cl. ....................... 165/260; 165/80.5; 165/263; 219/390; 118/724
(58) Field of Search ..................... 165/263, 80.2–80.5; 118/724, 728; 219/390, 444.1

(56) References Cited

U.S. PATENT DOCUMENTS 5,846,375 A * 12/1998 Gilchrist et al. ....... 156/345.52
6,102,113 A * 8/2000 Cowans ...................... 165/206
6,415,858 B1 * 7/2002 Getchel et al. ............. 165/206
6,544,338 B1 * 4/2003 Batchelder et al. ......... 118/641
2001/0017035 A1 * 8/2001 Sada et al. ..................... 62/99

FOREIGN PATENT DOCUMENTS

| JP | 63-193833 | 12/1988 |
| JP | 11-283896 | 10/1999 |
| JP | 2000-306796 | 11/2000 |
| JP | 2000-353707 | 12/2000 |

* cited by examiner

Primary Examiner—Terrell L McKinnon
(74) Attorney, Agent, or Firm—McDermott, Will & Emery

(57) ABSTRACT

A thermal processor comprises a thermal processing plate employing a heat pipe structure, a heater heating a working fluid and a cooling plate for reducing the temperature of the thermal processing plate. In order to reduce the temperature of the thermal processing plate, a cooling water supply part supplies cooling water to the cooling plate, for reducing the temperature of the thermal processing plate at a high speed. Then, a compressed air supply part supplies compressed air to the cooling plate, for reducing the temperature of the thermal processing plate at a low speed. Thus, a thermal processor capable of quickly reducing the temperature of a thermal processing plate to a set level without exerting bad influence on a result of processing a substrate is provided.

14 Claims, 8 Drawing Sheets

THERMAL PROCESSOR

BACKGROUND OF THE INVENTION

1. Field of the Invention

The present invention relates to a thermal processor for processing a substrate such as a semiconductor wafer, a glass substrate for a liquid crystal display panel or a mask substrate for a semiconductor manufacturing apparatus by heating the same with a thermal processing plate.

2. Description of the Background Art

Such a thermal processor is employed for heating a photoresist film formed on the substrate before exposure (pre-baking), after exposure (post-exposure baking) or after development (post-baking) in a semiconductor manufacturing step, for example.

This thermal processor comprises a built-in thermal processing plate comprising heating means in a processing chamber for heating the substrate placed on the upper surface of the thermal processing plate. A spherical member is arranged on the thermal processing plate to slightly project from the upper surface thereof, for heating the substrate in a state proximately supporting the same with a small space referred to as a proximity gap.

Various photoresist materials are recently employed in response to the characteristics of patterns formed on substrates, and the thermal processor processes the substrates at various temperatures in correspondence thereto. Therefore, the temperature of the thermal processing plate provided on the thermal processor is preferably controllable to an arbitrary level.

In order to change the temperature of the thermal processing plate to a level higher than a preceding set temperature, the thermal processing plate may be rapidly heated with a heater. In order to change the temperature of the thermal processing plate to a level lower than the preceding set temperature, however, the thermal processing plate must inevitably be cooled by heat radiation. Therefore, a long time is required for changing the temperature of the thermal processing plate to a level lower than the preceding set temperature.

Thus, a plurality of thermal processors are set in a conventional substrate processor in response to the types of processing temperatures for substrates, thereby thermally processing the substrates by the thermal processors corresponding to the processing temperatures therefor. In this case, however, a large number of thermal processors must be set in the substrate processor, disadvantageously leading to increase of the occupation area and the setting cost thereof.

In order to solve this problem, a thermal processor provided with a cooling mechanism for cooling a thermal processing plate is proposed in general so that the temperature of the thermal processing plate can be quickly changed to a level lower than a preceding set temperature by rapidly forcibly cooling the thermal processing plate with the cooling mechanism.

When an air-cooling system feeding gas such as compressed air into a passage for a cooling fluid thereby performing cooling is employed as the cooling mechanism for such a conventional thermal processor, however, the heat exchange effectiveness is so inferior that the temperature of the thermal processing plate is reduced at an extremely slow speed even if the flow rate of the gas is increased.

Therefore, a water cooling system may be employed for using cooling water such as water in place of the compressed air and feeding the same into the passage for the cooling fluid thereby performing cooling. When the water cooling system is employed, however, the cooling water remaining in the passage for the cooling fluid is heated to a temperature exceeding the boiling point thereof to boil when heating the substrate. Therefore, the temperature of the thermal processing plate may be rendered ununiform or the thermal processing plate may be vibrated to exert bad influence on the result of processing the substrate. When the passage for the cooling fluid is brought into a closed structure isolated from the atmosphere and the cooling water boils in this passage, the pressure in the passage for the cooling fluid is abruptly increased, leading to a possibility of explosion or the like.

SUMMARY OF THE INVENTION

The present invention is directed to a thermal processor for heating a substrate with a thermal processing plate.

According to the present invention, the thermal processor heating a substrate comprises a thermal processing plate receiving the substrate thereon, a heating mechanism heating the thermal processing plate, a temperature reducing mechanism, reducing the temperature of the thermal processing plate, comprising a passage passing a cooling fluid therethrough, a coolant supply part supplying a cooling liquid to the passage and a gas supply part supplying gas to the passage, and a control part controlling the coolant supply part and the gas supply part to supply the gas to the passage after supplying the cooling liquid to the passage.

Cooling liquid is supplied to the passage for the cooling fluid, whereby the temperature of the thermal processing plate can be quickly reduced through the cooling liquid when performing temperature reduction control of the thermal processing plate. Further, the gas is supplied to the passage for the cooling fluid, whereby it is possible to prevent such a phenomenon that the cooling liquid remains in the passage and boils to exert bad influence on the result of processing the substrate.

According to a preferred mode of the present invention, the control part supplies the cooling liquid to the passage for reducing the temperature of the thermal processing plate and thereafter supplies the gas to the passage for reducing the temperature of the thermal processing plate at a speed lower than the speed for reducing the temperature with the cooling liquid.

Cooling liquid is supplied to the passage for reducing the temperature of the thermal processing plate at a high speed and thereafter the gas is supplied to the said passage for reducing the temperature of the thermal processing plate at a low speed, whereby the temperature of the thermal processing plate can be quickly set to a set level with no overshoot.

Accordingly, an object of the present invention is to provide a thermal processor capable of quickly reducing the temperature of a thermal processing plate to a set level without exerting bad influence on the result of processing a substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
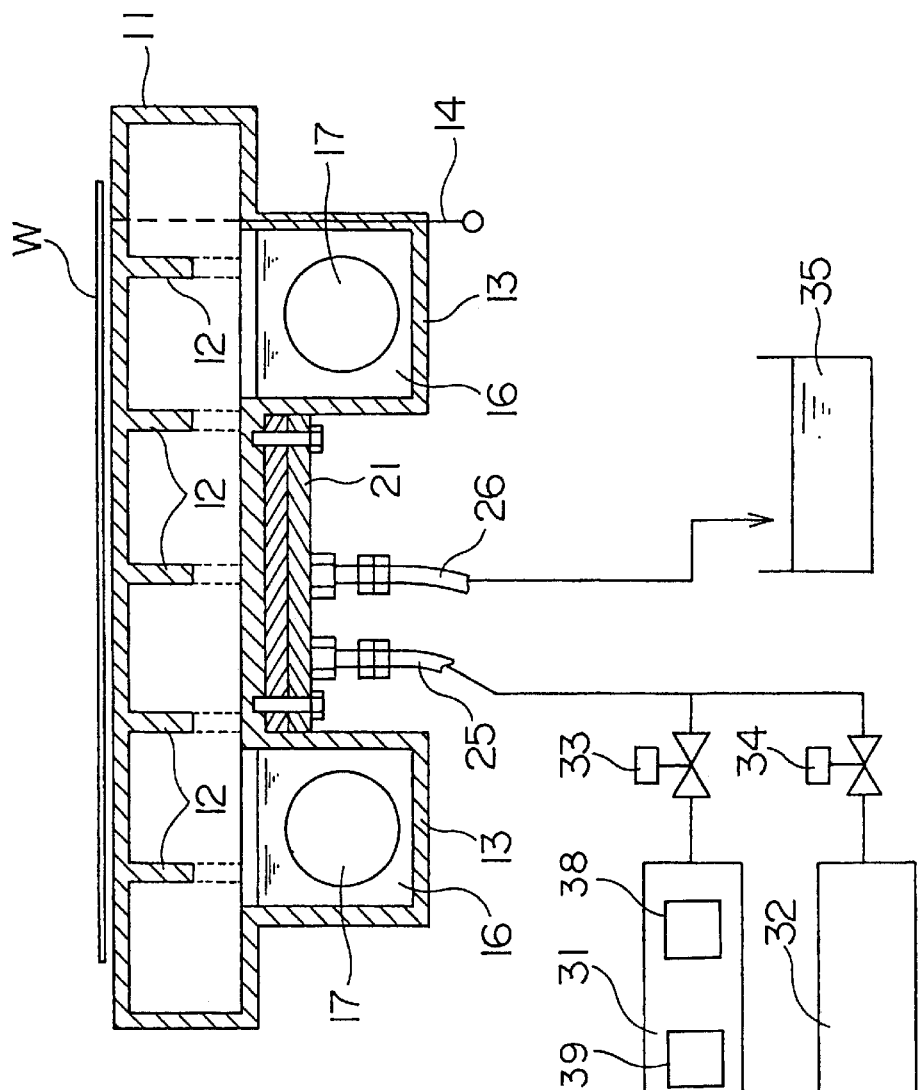
FIG. 1 is a schematic side elevational view of a thermal processor according to a first embodiment of the present invention.
Figure 2:
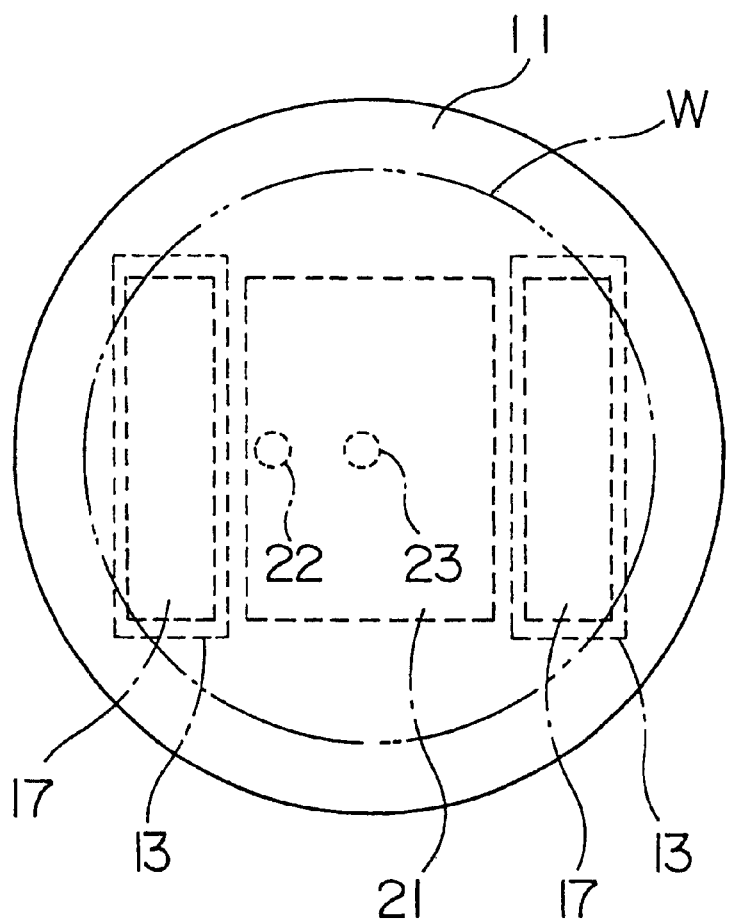
FIG. 2 is a schematic plan view of the thermal processor according to the first embodiment of the present invention.

Embodiments of the present invention are now described with reference to the drawings. FIG. 1 is a schematic side elevational view of a thermal processor according to a first embodiment of the present invention, and FIG. 2 is a schematic plan view thereof.

This thermal processor, employing a heat pipe structure for increasing in-plane uniformity of temperature distribution while reducing thermal capacity, comprises a thermal processing plate 11 having a hollow structure and a temperature sensor 14 for measuring the temperature of the thermal processing plate 11.

The thermal processing plate 11 receiving a substrate W thereon for thermally processing the same is formed in a hollow cylindrical shape by a metal material such as aluminum, for example, having excellent thermal conductivity. Three spherical bodies (not shown) made of a material such as alumina having low thermal conductivity are arranged on the surface of the thermal processing plate 11. The upper ends of the spherical bodies are so arranged as to slightly project from the surface of the thermal processing plate 11, for receiving and supporting the substrate W on the spherical bodies of the thermal processing plate 11 and heating the substrate W while keeping a small space referred to as a proximity gap between the substrate W and the surface of the thermal processing plate 11.

The substrate W may alternatively be placed on the thermal processing plate 11 in a state directly in contact with the surface of the thermal processing plate 11.

The internal space of the thermal processing plate 11 is decompressed for the heat pipe structure, and a plurality of rims 12 are formed for reinforcing the strength thereof. A pair of working fluid chambers 13 are provided under the internal space of the thermal processing plate 11. The working fluid chambers 13 store a working fluid 16 such as water. Heaters 17 for heating the working fluid 16 are arranged in the working fluid chambers 13.

In this thermal processor, the heaters 17 are driven to heat the working fluid 16 so that vapor of the working fluid 16 moves through the internal space of the thermal processing plate 11 and transfers latent heat of vaporization between the same and the thermal processing plate 11 thereby heating the thermal processing plate 11. The vapor of the working fluid 16 transferring latent heat of vaporization between the same and the thermal processing plate 11 returns to the working fluid 16, which in turn is collected in the working fluid chambers 13.

In order to change the temperature for thermally processing the substrate W to a level lower than a preceding set temperature in response to the type of photoresist or the like in this thermal processor, it is necessary to rapidly forcibly cool the thermal processing plate 11. Therefore, the thermal processor is provided with a cooling plate 21 on the lower surface of the thermal processing plate 11 between the pair of working fluid chambers 13. The structure of the cooling plate 21 is described later in detail.

Figure 3:
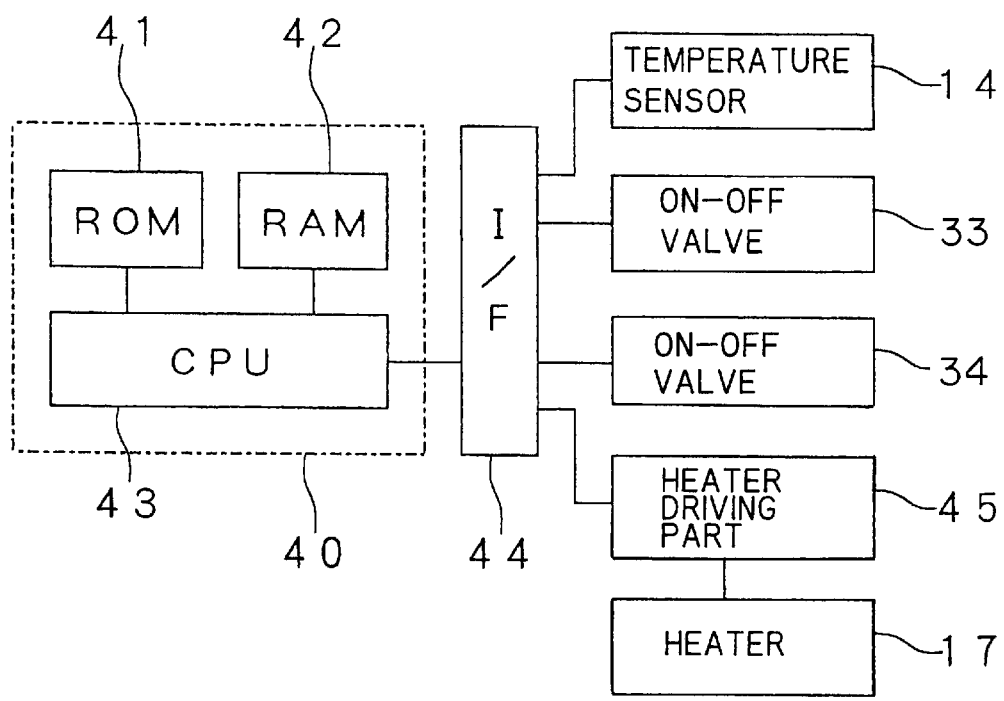
FIG. 3 is a block diagram showing a principal electric structure of the thermal processor according to the first embodiment of the present invention.

A principal electric structure of the thermal processor according to the first embodiment of the present invention is now described. FIG. 3 is a block diagram showing the principal electric structure of the thermal processor according to the first embodiment of the present invention.

The thermal processor comprises a control part 40 consisting of a ROM 41 storing an operation program necessary for controlling the processor, a RAM 42 temporarily storing data or the like in control and a CPU 43 executing logic operations. The control part 40 is connected with the aforementioned temperature sensor 14 and on-off valves 33 and 34 through an interface 44. The control part 40 is also connected with a heater driving part 45 for driving the aforementioned heaters 17.

Figure 4:
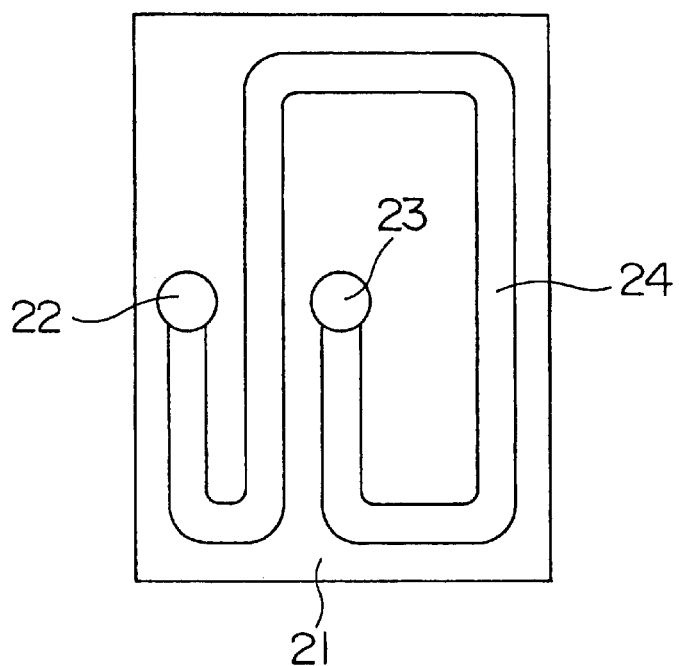
FIG. 4 is a plan view of a cooling plate.

The structure of the aforementioned cooling plate 21 is now described. FIG. 4 is a plan view of the cooling plate 21.

The cooling plate 21 is formed by bonding two metal plates having high thermal conductivity to each other, and a cooling fluid passage 24 is formed on the bonded surface. An end of the cooling fluid passage 24 is connected to an inlet port 22, while the other end is connected to an outlet port 23. The cooling fluid passage 24 reaching the outlet port 23 from the inlet port 22 is formed in a meandering manner for increasing the length thereof.

As shown in FIG. 1, a supply pipe 25 mounted on the inlet port 22 is connected with a coolant (cooling liquid) supply part 32 through the on-off valve 34. The supply pipe 25 is also connected with a supply part 31 for compressed air serving as cooling gas through the on-off valve 33. On the other hand, a discharge pipe 26 mounted on the outlet port 23 is connected with a drain 35 opened to the atmosphere.

According to this embodiment, cooling water (simple water) is employed as the coolant. However, the coolant is not restricted to the cooling water but another cooling medium such as a chemical such as ethylene glycol, for example, may alternatively be employed.

In order to change the temperature for thermally processing the substrate W to a level lower than the preceding set temperature, the cooling plate 21 having such a structure circulates the cooling water supplied from the coolant supply part 32 through the cooling fluid passage 24 for reducing the temperature of the thermal processing plate 11 at a high speed. The cooling water employed for reducing the temperature of the thermal processing plate 11 is discharged into the drain 35 opened to the atmosphere.

If the cooling water remains in the cooling fluid passage 24 after the operation for reducing the temperature of the thermal processing plate 11, this cooling water is heated to a temperature exceeding its boiling point when a subsequent substrate W is heated, to render the temperature of the thermal processing plate 11 ununiform or vibrate the same and exert bad influence on the result of processing the substrate W. Therefore, the thermal processor supplies the cooling water to the cooling fluid passage 24 for reducing the temperature of the thermal processing plate 11 at a high speed and thereafter supplies compressed air to the passage 24 from the compressed air supply part 31.

Figure 5:
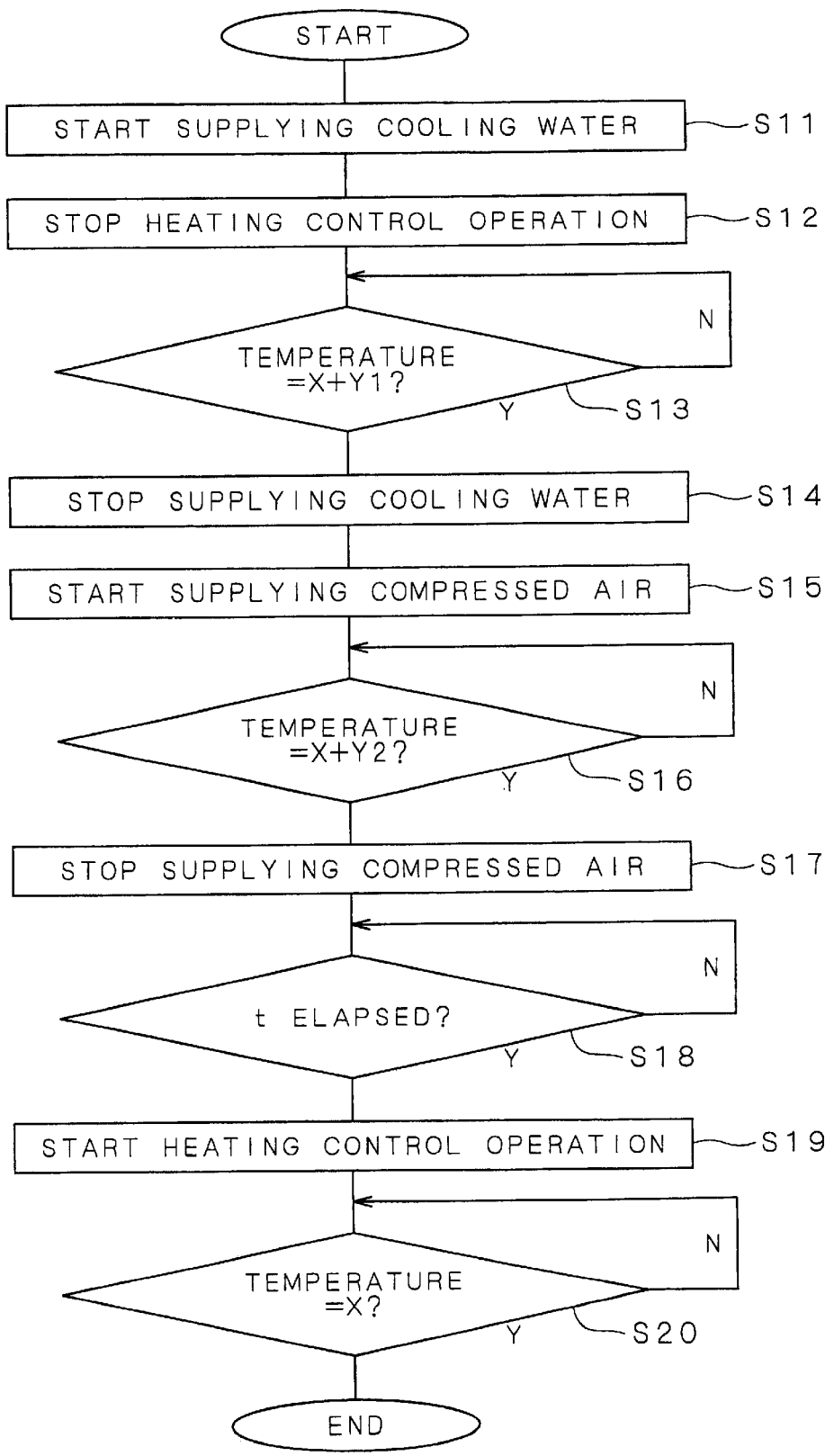
FIG. 5 is a flow chart showing a temperature reducing operation for a thermal processing plate according to the first embodiment of the present invention.

The operation of reducing the temperature of the thermal processing plate 11 for setting the temperature for thermally processing the substrate W to a new set temperature X lower than the preceding set temperature in the thermal processor having the aforementioned structure is now described. FIG. 5 is a flow chart showing the operation of reducing the temperature of the thermal processing plate 11 according to the first embodiment of the present invention.

In order to change the temperature of the thermal processing plate 11 set to a preceding set temperature for thermally processing a substrate W of a certain lot to the new set temperature X for thermally processing a substrate W of another lot in continuation, the temperature of the thermal processing plate 11 is reduced through the cooling plate 21 in the following control operation:

First, the on-off valve 34 is opened under control of the control part 40, for supplying the cooling water to the cooling fluid passage 24 in the cooling plate 21 from the coolant supply part 32 (step S11). Thus, the thermal processing plate 11 is rapidly cooled due to the action of the cooling water so that the temperature thereof is reduced at a high speed.

In parallel with the aforementioned step, a heating control operation of the heater driving part 45 for the heaters 17 is stopped (step S12). In other words, the control part 40 issues a command to the heater driving part 45 thereby stopping the whole control operation of the heater driving part 45 for the heaters 17.

The control part 40 monitors the temperature of the thermal processing plate 11 detected by the temperature sensor 14 and determines whether or not the temperature of the thermal processing plate 11 reaches a level higher by a value Y1 than the new set temperature X (step S13).

If the temperature of the thermal processing plate 11 reaches the level higher by the value Y1 than the new set temperature X, the on-off valve 34 is closed under control of the control part 40 thereby stopping supply of the cooling water (step S14).

In parallel with the aforementioned step, the on-off valve 33 is opened under control of the control part 40 thereby supplying compressed air into the cooling fluid passage 24 in the cooling plate 21 from the compressed air supply part 31 (step S15). Thus, the cooling water is discharged from the cooling fluid passage 24 while the temperature of the thermal processing plate 11 is reduced at a low speed due to the action of the compressed air.

When the temperature of the thermal processing plate 11 reaches a level higher by a value Y2 than the new set temperature X, the on-off valve 33 is closed under control of the control part 40 thereby stopping supply of the compressed air (step S17). Thus, it follows that the thermal processing plate 11 is cooled only by heat radiation thereof.

In this state, a lapse of a constant delay time t is waited (step S18).

When the delay time t elapses, the heater driving part 45 starts the heating control operation for the heaters 17 (step S19). In other words, the control part 40 issues a command to the heater driving part 45 for restarting the control operation for the heaters 17.

When the temperature of the thermal processing plate 11 reaches the new set temperature X (step S20), the temperature reducing operation is ended.

The aforementioned constant delay time t is employed for the following reason: The thermal processor employs the heater driving part 45 utilizing PID control or the like for measuring the temperature of the thermal processing plate 11 with time thereby controlling the heating operation of the heater 17 and setting the temperature of the thermal processing plate 11 to the new set temperature X. Respective coefficients etc. used for the current PID control or the like are set under such a condition that the temperature of the thermal processing plate 11 is reduced in an ordinary state.

When the thermal processing plate 11 is forcibly cooled with the cooling water or the compressed air in the thermal processor according to the first embodiment, however, the heater driving part 45 executes control of the heaters 17 in consideration of the speed for reducing the temperature in forcible cooling, and hence overshoot disadvantageously takes place with respect to the new set temperature X.

However, this embodiment provides the aforementioned constant delay time t so that the thermal processing plate 11 is not forcibly cooled with the cooling water or the compressed air during the delay time t, whereby the temperature of the thermal processing plate 11 is reduced in an ordinary state. Therefore, the temperature of the thermal processing plate 11 is quickly set to the new set temperature X with no overshoot.

The aforementioned value Y2 for stopping the cooling operation is preferably decided as follows:

$$Y2=aX+b$$

where a and b represent constants. This is because it has been experimentally recognized that the temperature of the thermal processing plate 11 is reduced at a higher temperature as the new set temperature X is increased when the same is reduced by gas such as compressed air and the speed is proportionate to the linear equation of the new set temperature X.

The aforementioned delay time t corresponds to a time necessary for shifting the speed for reducing the temperature of the thermal processing plate 11 from a state influenced by forcible cooling to an ordinary state. This delay time t can be experimentally obtained in consideration of the thermal capacity etc. of the thermal processing plate 11.

The thermal processor having the aforementioned structure first cooling the thermal processing plate 11 through the cooling water can reduce the temperature of the thermal processing plate 11 at a high speed. Thereafter the thermal processor reduces the temperature of the thermal processing plate 11 at a low speed through the compressed air, thereby quickly setting the thermal processing plate 11 to the set temperature X with no overshoot in the temperature reducing operation.

At this time, the cooling water precedently supplied into the cooling fluid passage 24 to remain therein is discharged from the passage 24 by the compressed air subsequently supplied into the cooling fluid passage 24. Therefore, it is possible to effectively prevent such a phenomenon that the cooling water remaining in the cooling fluid passage 24 is heated to a temperature exceeding its boiling point to boil when the substrate W is heated.

In the thermal processor according to this embodiment, the cooling fluid passage 24 is connected with the drain 35 opened to the atmosphere. Even if the cooling water boils in the cooling fluid passage 24 due to a malfunction of the thermal processor or the like, therefore, the pressure in boiling can be discharged from the drain 35 opened to the atmosphere. Therefore, it is possible to avoid such a possibility that the pressure in the cooling fluid passage 24 is abruptly increased to cause explosion or the like.

While the aforementioned thermal processor according to the first embodiment reduces the temperature of the thermal processing plate 11 at a high speed with the cooling water and thereafter reduces the temperature of the thermal processing plate 11 at a low speed with the compressed air, the compressed air may alternatively be used only for discharging the cooling water remaining in the cooling fluid passage 24.

Figure 6:
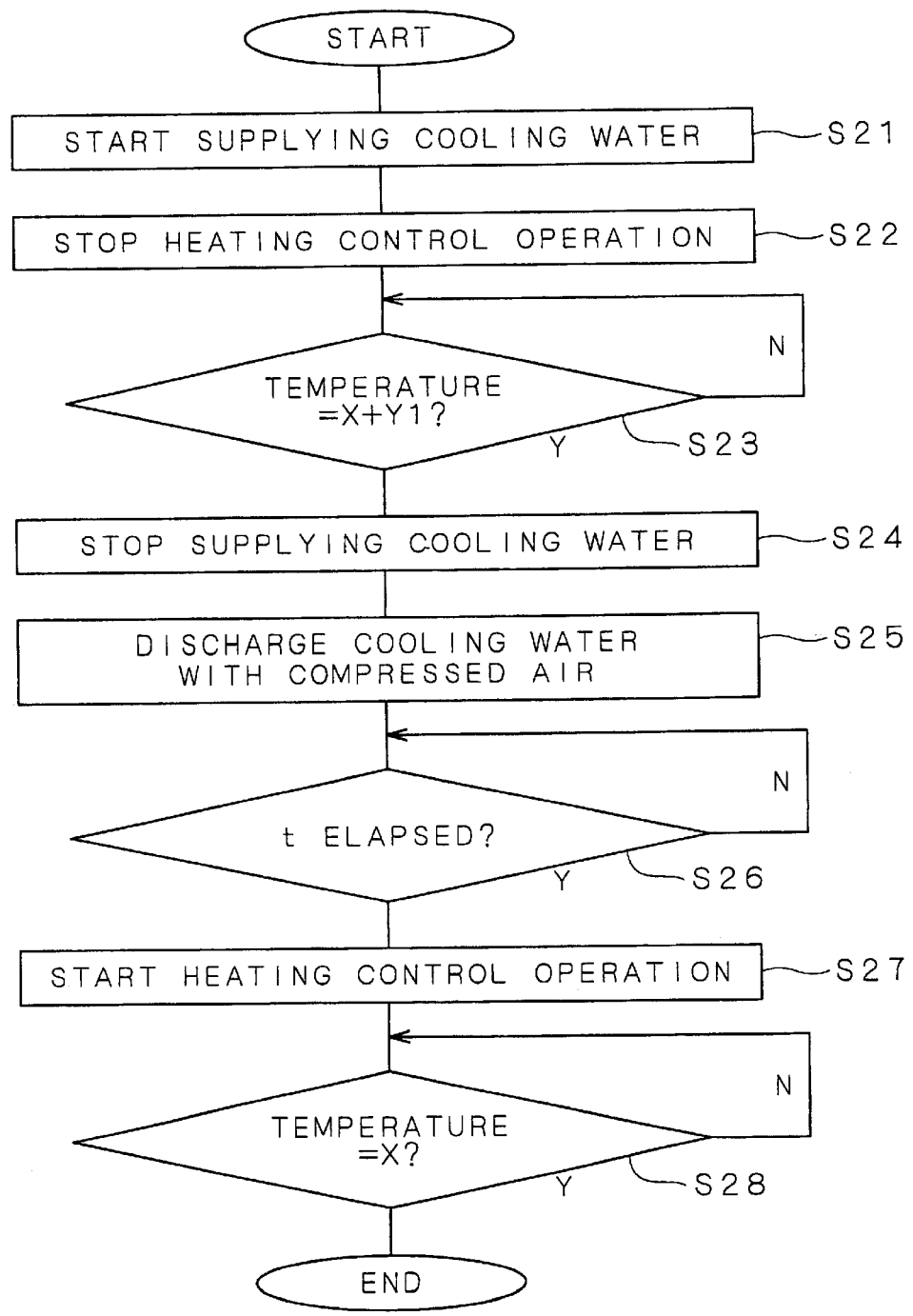
FIG. 6 is a flow chart showing a temperature reducing operation for a thermal processing plate according to a second embodiment of the present invention.

FIG. 6 is a flow chart showing such a temperature reducing operation for a thermal processing plate 11 according to a second embodiment of the present invention.

In order to change the temperature of the thermal processing plate 11 to a new set temperature X, an on-off valve 34 is first opened under control of a control part 40 thereby supplying cooling water into a cooling fluid passage 24 in a cooling plate 21 from a coolant supply part 32 (step 21). Thus, the thermal processing plate 11 is rapidly cooled due to the action of the cooling water so that the temperature thereof is reduced at a high speed.

In parallel with the aforementioned step, a heating control operation of a heater driving part 45 for heaters 17 is stopped (step S22). In other words, the control part 40 issues a command to the heater driving part 45 thereby stopping the whole control operation of the heater driving part 45 for the heaters 17.

The control part 40 monitors the temperature of the thermal processing plate 11 detected by a temperature sensor 14, and determines whether or not the temperature of the thermal processing plate 11 reaches a level higher by a value Y1 than the new set temperature X (step S23).

When the temperature of the thermal processing plate 11 reaches the level higher by the value Y1 than the new set temperature X, the on-off valve 34 is closed under control of the control part 40 thereby stopping supply of the cooling water (step S24).

In parallel with the aforementioned step, an on-off valve 33 is opened under control of the control part 40 thereby supplying compressed air into the cooling fluid passage 24 in the cooling plate 21 from a compressed air supply part 31 (step S25). This supply of the compressed air is stopped when the cooling water remaining in the cooling fluid passage 24 is discharged.

In this state, a lapse of a constant delay time t is waited (step S26).

When the delay time t elapses, the heater driving part 45 starts the heating control operation for the heaters 17 (step S27). In other words, the control part 40 issues a command to the heater driving part 45 thereby restarting the control operation of the heater driving part 45 for the heaters 17.

When the temperature of the thermal processing plate 11 reaches the new set temperature X (step S28), the temperature reducing operation is ended.

Also in this case, the thermal processor according to the second embodiment first cools the thermal processing plate 11 with the cooling water, whereby the temperature of the thermal processing plate 11 can be reduced at a high speed. The cooling water remaining in the cooling fluid passage 24 is discharged by the compressed air supplied into the cooling fluid passage 24, whereby it is possible to effectively prevent such a phenomenon that the cooling water remaining in the cooling fluid passage 24 is heated to a temperature exceeding its boiling point to boil when a substrate W is heated.

The constant delay time t is provided also in the second embodiment so that the temperature of the thermal processing plate 11 is reduced in an ordinary state during the delay time t, whereby the temperature of the thermal processing plate 11 can be quickly set to the new set temperature X with no overshoot also when the temperature of the thermal processing plate 11 is reduced only by the cooling water.

In each of the aforementioned first and second embodiments, the on-off valve 34 is provided between the coolant supply part 32 and the cooling plate 21 and opened/closed under control of the control part 40 for determining whether or not to supply the cooling water to the cooling fluid passage 24 in the cooling plate 21 thereby controlling the operation of reducing the temperature of the thermal processing plate 11. Alternatively, the operation of reducing the temperature of the thermal processing plate 11 may be controlled by controlling the flow rate of the cooling water supplied to the cooling fluid passage 24 in the cooling plate 21.

Figure 7:
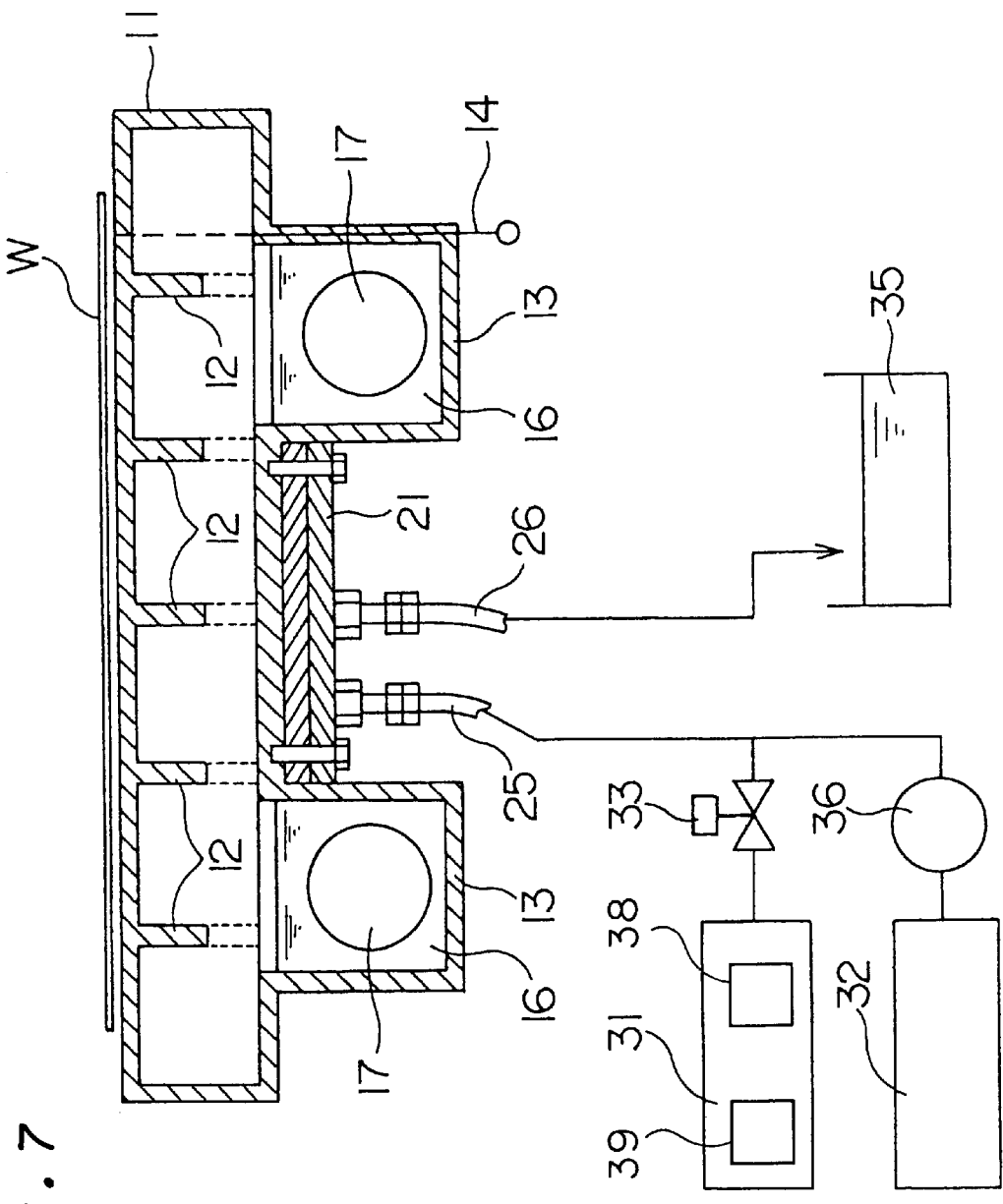
FIG. 7 is a schematic side elevational view of a thermal processor according to a third embodiment of the present invention.
Figure 8:
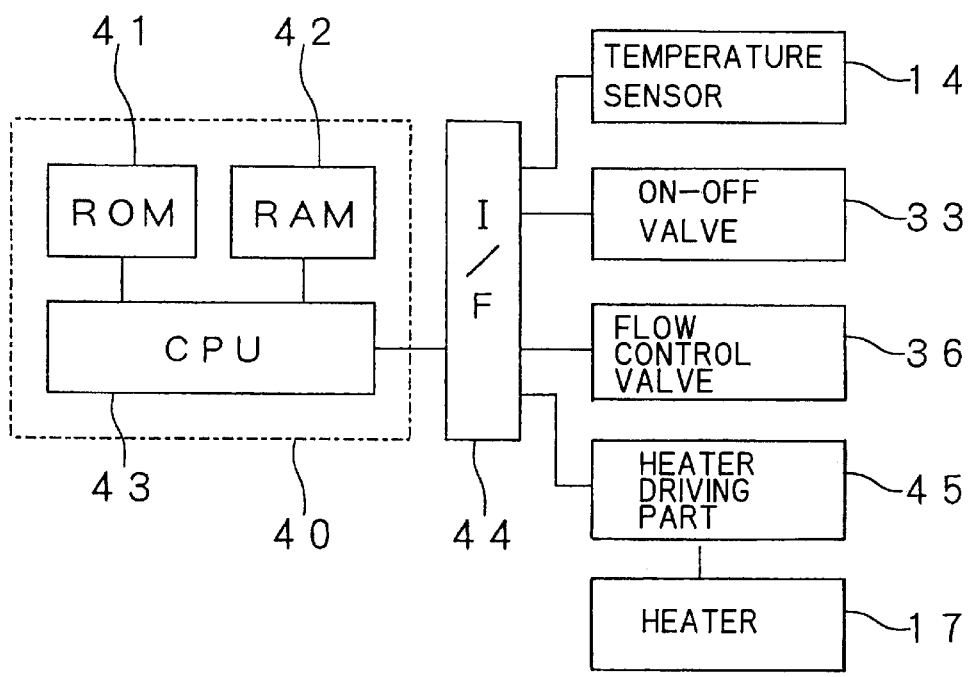
FIG. 8 is a block diagram showing a principal electric structure of the thermal processor according to the third embodiment of the present invention.

FIG. 7 is a schematic side elevational view of a thermal processor according to a third embodiment, and FIG. 8 is a block diagram showing a principal electric structure thereof. Members identical to those of the thermal processors according to the aforementioned first and second embodiments are denoted by the same reference numerals, to omit redundant description.

The thermal processor according to the third embodiment is similar in structure to those according to the aforementioned first and second embodiments except that a flow control valve 36 capable of continuously controlling the flow rate of cooling water supplied to a cooling fluid passage 24 under control of a control part 40 is employed in place of the on-off valve 34 according to each of the first and second embodiments.

In order to reduce the temperature of a thermal processing plate 11 in the thermal processor according to the third embodiment, the cooling water is supplied in the following mode in steps similar to the steps S11 to S14 of the first embodiment shown in FIG. 5 and the steps S21 to S24 of the second embodiment shown in FIG. 6:

Assuming that ΔT represents the difference between the temperature of the thermal processing plate 11 detected by a temperature sensor 14 and a new set temperature X and e represents a constant, the flow rate of the cooling water is so controlled that the flow rate Q of the cooling water supplied into the cooling fluid passage 24 satisfies the following equation, while the cooling water is supplied at the maximum flow rate if the difference ΔT between the detected temperature of the thermal processing plate 11 and the new set temperature X is so large that the flow rate Q exceeds the maximum flow rate of the cooling water suppliable to the cooling fluid passage 24:

$$Q=e\cdot\Delta T$$

Also when this structure is employed, the thermal processing plate 11 can be quickly set to the new set temperature X with no overshoot.

While each of the aforementioned embodiments employs the thermal processing plate 11 utilizing the heat pipe structure and heats or cools the thermal processing plate 11 by transferring latent heat of vaporization between the heaters 17 or the cooling plate 21 and the thermal processing plate 11, the thermal processing plate 11 may alternatively be directly heated with a planar heater, for example, or may alternatively be directly cooled by the cooling plate 21. In other words, the heating mechanism according to the present invention is not restricted to the heat pipe structure.

As shown in each of FIGS. 1 and 7, further, an air cooling part 39 for cooling the compressed air supplied into the passage 24 of the cooing plate 21 may be provided on the supply part 31. When compressed air cooled by the air cooling part 39 is supplied into the passage 24, the thermal processing plate 11 can be more quickly set to the new set temperature X. The air cooling pat 39 may alternatively be provided between the supply part 31 and the cooling plate 21.

As shown in each of FIGS. 1 and 7, further, an air drying part 38 for drying the compressed air supplied into the passage 24 of the cooling plate 21 may be provided in the supply part 31. When compressed air dried by the air drying part 38 is supplied into the passage 24, the evaporation rate of the cooling water remaining in the passage 24 is increased so that the cooling water is more completely removed from the passage 24, whereby it is possible to more reliably prevent the cooling water remaining in the passage 24 from boiling. Particularly when the air drying part 38 is provided along with the air cooling part 39, the thermal processing plate 11 can be more quickly cooled while reliably removing the cooling water remaining in the passage 24. The air drying part 38 may also be provided between the supply part 31 and the cooling plate 21.

The thermal processor according to the present invention employs water as the coolant, whereby the cost therefor is smaller than that for a chemical and the cost for disposal thereof is also small. While each of the aforementioned embodiments employs water as the coolant, the present invention is effective also when an aqueous solution of some material or a liquid containing no water is employed as the coolant. In other words, the compressed air expels the coolant from the passage 24, so that no coolant remains in the passage 24. Also when the aforementioned new set temperature X lower than the preceding set temperature exceeds the boiling point of the coolant, therefore, the coolant will not abruptly boil in the passage 24.

While the invention has been shown and described in detail, the foregoing description is in all aspects illustrative and not restrictive. It is therefore understood that numerous modifications and variations can be devised without departing from the scope of the invention.

What is claimed is:

1. A thermal processor heating a substrate, comprising:
    a thermal processing plate receiving said substrate thereon;
    a heating mechanism heating said thermal processing plate;
    a temperature reducing mechanism, reducing the temperature of said thermal processing plate, comprising:
        a passage passing a cooling fluid therethrough,
        a coolant supply part supplying a cooling liquid to said passage, and
        a gas supply part supplying gas to said passage; and
    a control part controlling said coolant supply part and said gas supply part to supply said gas to said passage when the temperature of said thermal processing plate is reduced to a predetermined temperature after supplying said cooling liquid to said passage.

2. The thermal processor according to claim 1, wherein said control part supplies said cooling liquid to said passage for reducing the temperature of said thermal processing plate and thereafter supplies said gas to said passage for reducing the temperature of said thermal processing plate at a speed lower than the speed for reducing the temperature with said cooling liquid.

3. The thermal processor according to claim 2, wherein said control part supplies said gas to said passage for reducing the temperature of said thermal processing plate and thereafter controls said heating mechanism so that said thermal processing plate maintains a target set temperature after a lapse of a prescribed time from stoppage of gas supply to said passage.

4. The thermal processor according to claim 3, wherein said temperature reducing mechanism further comprises:
    a gas cooling part cooling said gas supplied from said gas supply part to said passage.

5. The thermal processor according to claim 1, wherein said control part supplies said cooling liquid to said passage for reducing the temperature of said thermal processing plate and thereafter supplies said gas to said passage for discharging said cooling liquid remaining in said passage from said passage.

6. The thermal processor according to claim 5, wherein said temperature reducing mechanism further comprises:
    a gas drying part drying said gas supplied from said gas supply part to said passage.

7. The thermal processor according to claim 1, wherein said temperature reducing mechanism further comprises:
    a flow control part controlling the flow rate of said cooling liquid supplied from said coolant supply part to said passage, and
    said flow control part feeds said cooling liquid to said passage at a flow rate proportionate to the difference between the temperature of said thermal processing plate and a target set temperature.

8. A thermal processor heating a substrate, comprising:
    a thermal processing plate receiving said substrate thereon;
    heating means heating said thermal processing plate;
    temperature reducing means, reducing the temperature of said thermal processing plate, comprising:
        a passage passing a cooling fluid therethrough,
        coolant supply means supplying a cooling liquid to said passage, and
        gas supply means supplying gas to said passage; and
    control means controlling said coolant supply means and said gas supply means to supply said gas to said passage when the temperature of said thermal processing elate is reduced to a predetermined temperature after supplying said cooling liquid to said passage.

9. he thermal processor according to claim 8, wherein said control means supplies said cooling liquid to said passage for reducing the temperature of said thermal processing plate and thereafter supplies said gas to said passage for reducing the temperature of said thermal processing plate at a speed lower than the speed for reducing the temperature with said cooling liquid.

10. The thermal processor according to claim 9, wherein said control means supplies said gas to said passage for reducing the temperature of said thermal processing plate and thereafter controls said heating means so that said thermal processing plate maintains a target set temperature after a lapse of a prescribed time from stoppage of gas supply to said passage.

11. The thermal processor according to claim 10, wherein said temperature reducing means further comprises:
    gas cooling means cooling said gas supplied from said gas supply means to said passage.

12. The thermal processor according to claim 8, wherein said control means supplies said cooling liquid to said passage for reducing the temperature of said thermal processing plate and thereafter supplies said gas to said passage for discharging said cooling liquid remaining in said passage from said passage.

13. The thermal processor according to claim 12, wherein said temperature reducing means further comprises:
    gas drying means drying said gas supplied from said gas supply means to said passage.

14. The thermal processor according to claim 8, wherein said temperature reducing means further comprises:
    flow control means controlling the flow rate of said cooling liquid supplied from said coolant supply means to said passage, and
    said flow control means feeds said cooling liquid to said passage at a flow rate proportionate to the difference between the temperature of said thermal processing plate and a target set temperature.

* * * * *